United States Patent
Ishida et al.

(10) Patent No.: US 6,329,875 B1
(45) Date of Patent: Dec. 11, 2001

(54) POWER AMPLIFIER, POWER CONTROL METHOD FOR POWER AMPLIFIER, AND COMMUNICATION EQUIPMENT

(75) Inventors: Kaoru Ishida, Shijonawate; Toshio Obara, Yokohama; Hiroaki Kosugi, Hirakata; Naoki Komatsu, Moriguchi, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/514,777

(22) Filed: Feb. 28, 2000

(30) Foreign Application Priority Data

Feb. 26, 1999 (JP) .................................. 11-049995
Oct. 12, 1999 (JP) .................................. 11-289579

(51) Int. Cl.$^7$ ........................................ H03F 1/14
(52) U.S. Cl. ................................ 330/51; 330/151
(58) Field of Search ........................ 330/51, 150, 151, 330/302, 310

(56) References Cited

U.S. PATENT DOCUMENTS 6,118,989 * 9/2000 Abe et al. ................... 330/51 X

FOREIGN PATENT DOCUMENTS

| 6-53753 | 2/1994 | (JP) . |
| 7-115331 | 5/1995 | (JP) . |
| 7-336168 | 12/1995 | (JP) . |
| 10-32441 | 2/1998 | (JP) . |
| 10-327082 | 12/1998 | (JP) . |

OTHER PUBLICATIONS

CDMA System and Advanced Mobile Communication System. Jun. 1, 1996.

* cited by examiner

Primary Examiner—Steven J. Mottola
(74) Attorney, Agent, or Firm—Ratner & Prestia, PC

(57) ABSTRACT

A power amplifier has an input terminal; an output terminal; an N number of bypassable amplification circuits which are connected directly or indirectly in a sequential manner between the input terminal and the output terminal; an impedance conversion circuit which is connected directly or indirectly between the amplification circuit of a final stage and the output terminal; and a bias control circuit which controls the amplification circuits, each of the amplification circuits is configured by a high-frequency switch circuit, and an amplifier which is connected directly or indirectly to the switch circuit, and the bias control circuit controls power source voltages of the amplifiers and controls status of the switch circuit.

23 Claims, 13 Drawing Sheets

POWER AMPLIFIER, POWER CONTROL METHOD FOR POWER AMPLIFIER, AND COMMUNICATION EQUIPMENT

BACKGROUND OF THE INVENTION

1. Field of the Invention

The present invention relates to a power amplifier, a control method for such a power amplifier, and a communication equipment which are used mainly in a mobile communication system.

2. Related Art of the Invention

Recently, digital mobile communication system rapidly enters widespread use, and miniaturization of a communication terminal, and reduction of power consumption are advancing. As a successor to a currently used digital portable telephone, also a portable telephone using the CDMA (Code Division Multiple Access) system which can ensure a larger communication capacity is being developed. The CDMA system is described in detail in "CDMA HOSHIKI TO JISEDAI IDOTAI TSUSHIN SYSTEM" (Chap. 1, TROR-IKEPSU SOSHO), and hence its detailed description is omitted.

Hereinafter, a power amplifier of the conventional art will be described with reference to FIGS. 13 and 14. FIG. 13. is a diagram showing the configuration of power amplifier of the convention art. Referring to FIG. 13, 701 denotes an input terminal, 702 denotes a preamplifier, 703 denotes a postamplifier, and 704 denotes an output terminal.

FIG. 14 is a graph showing a consumed current, an amount of distortion, and an efficiency with respect to an output power of the power amplifier of the conventional art. In FIG. 14, the solid lines show variations of characteristics in the case where the initial currents are set to be similar to set values in a power amplifier of a conventional digital portable telephone of the TDMA system, and the broken lines show characteristics in the case where the initial currents of the preamplifier and the postamplifier shown in FIG. 13 are set to be a half of the values.

Generally a power amplifier is controlled so that efficiency at maximum output becomes maximum. But in the CDMA portable telephone system, the power output is controlled in such wide range of exceeding 70 dB from maximum output in accordance with the distance between a telephone and a base station. Therefore it is demanded to satisfy high efficiency for whole power output range.

However as shown in FIG. 14, in the case where the initial currents are set to be similar to those in the TDMA system, the efficiency becomes poor because the consumed current at low output is large. On the contrary when the initial currents are half, the amount of distortion near maximum output becomes poor. Therefore the initial currents of the power amplifier are to be set as smallest within tolerable amount of distortion.

In this configuration, when the output power of the power amplifier is reduced, the efficiency is lowered and a current which is not actually necessary is consumed. In the CDMA system, particularly, the time period when transmission is performed at a power of a reduced level is longer than that when transmission is performed at the maximum power, and therefore the battery power is largely consumed, with the result that the talk time is shortened.

In order to improve the efficiency at the reduction of the output power, the initial current may be set to be close to that of Class B (the initial current is reduced in level). In this case, however, the distortion level is impaired. Therefore, the reduction of the initial current is limited.

SUMMARY OF THE INVENTION

The invention has been conducted in view of the problems of the power amplifier of the conventional art. It is an object of the invention to provide a power amplifier the efficiency of which is not impaired even in the CDMA system, and a control method for the power amplifier.

In order to solve the problems, the power amplifier of the present invention comprises: an input terminal; an output terminal; an N number of bypassable amplification circuits which are connected directly or indirectly in a sequential manner between said input terminal an d said output terminal; an impedance conversion circuit which is connected directly or indirectly between said amplification circuit of a final stage and said output terminal; and a bias control circuit which controls said amplification circuits, each of said amplification circuits is configured by a high-frequency switch circuit, and an amplifier which is connected directly or indirectly to said switch circuit, and said bias control circuit controls power source voltages of said amplifiers and controls status of said switch circuit.

A power amplifier of the present invention comprises: an input terminal; a first high-frequency switch circuit which can output a signal input to said input terminal while switching to two output terminals; a first amplifier which is connected directly or indirectly to one of said output terminals of said first high-frequency switch circuit; a second high-frequency switch circuit which is connected directly or indirectly to an output terminal of said first amplifier and another one of said output terminals of said first high-frequency switch circuit, and which can independently output two signals respectively input from said output terminals while switching to two output terminals; a second amplifier which is connected directly or indirectly to one of said output terminals of said second high-frequency switch circuit; an impedance conversion circuit which is connected directly or indirectly to another one of said output terminals of said second high-frequency switch circuit; an output terminal which is commonly connected directly or indirectly to an output terminal of said second amplifier and an output terminal of said impedance conversion circuit; and a bias control circuit which controls power source voltages of said first and second amplifiers and controls status of said switch circuit.

A power amplifier of the present invention comprises: an input terminal; a first high-frequency switch circuit which can output a signal input to said input terminal while switching to two output terminals; a first amplifier which is connected directly or indirectly to one of said output terminals of said first high-frequency switch circuit; a second high-frequency switch circuit which is connected directly or indirectly to an output terminal of said first amplifier and another one of said output terminals of said first high-frequency switch circuit, and which can independently output two signals respectively input from said output terminals while switching to two output terminals; a second amplifier which is connected directly or indirectly to one of said output terminals of said second high-frequency switch circuit; a third high-frequency switch circuit which is connected directly or indirectly to an output terminal of said second amplifier and another one of said output terminals of said second high-frequency switch circuit, and which can independently output two signals respectively input from said output terminals while switching to two output terminals; a third amplifier which is connected directly or indirectly to one of said output terminals of said third high-frequency switch circuit; an impedance conversion circuit which is connected directly or indirectly to another one of said output terminals of said third high-frequency switch circuit; an output terminal which is commonly connected directly or indirectly to an output terminal of said third amplifier and an output terminal of said impedance conversion circuit; and a bias control circuit which controls power source voltages of said first, second, and third amplifiers and controls status of said switch circuit.

A power amplifier of the present invention comprises: an input terminal; a first high-frequency switch circuit which can output a signal input to said input terminal while switching to two output terminals; a first amplifier which is connected directly or indirectly to one of said output terminals of said first high-frequency switch circuit; impedance switching means which is connected directly or indirectly to an output terminal of said first amplifier; a second high-frequency switch circuit which is connected directly or indirectly to another one of said output terminals of said first high-frequency switch circuit and an output terminal of said impedance switching means, and which can independently output two signals respectively input from said output terminals while switching to three output terminals; a first final amplifier which is connected directly or indirectly to a first one of said output terminals of said second high-frequency switch circuit; a second final amplifier which is connected directly or indirectly to a second one of said output terminals of said second high-frequency switch circuit; a impedance conversion circuit which is connected directly or indirectly to a third one of said output terminals of said second high-frequency switch circuit; an output terminal which is commonly connected directly or indirectly to said first and second final amplifiers, and said impedance conversion circuit; and a bias control circuit which controls power source voltages of said first amplifier, and said first and second final amplifiers, on/of operations of said impedance switching means, and switching operations of said first and second high-frequency switch circuits.

A power control method of the present invention for a power amplifier comprising: at least two stages of power amplifiers; a bypass circuit which is connected in parallel to said power amplifiers; a high-frequency switch circuit which is connected to input/output terminals of said power amplifiers and said bypass circuit, and a bias control circuit, is such method that said high-frequency switch circuit switches over said power amplifiers and said bypass circuit in accordance with an output power of a whole of said amplifier, and said bias control circuit interrupts a power source of a power amplifier which is not used.

According to this configuration, in accordance with reduction of the transmission power by at least two stages of power amplifiers, the amplifier of a higher power is bypassed by a high-frequency switch, and the power source of the bypassed amplifier is cut off, whereby the efficiency in transmission at a low power can be improved. When the transmission power is further reduced, the amplifier in front of the bypassed amplifier is bypassed, and the power source of the newly bypassed amplifier is cut off, thereby further improving the efficiency. By repeating this operation, the efficiency can be improved in a broad dynamic range in transmission.

When the output power is lowered, therefore, the final amplifier is bypassed by a bypass circuit using a high-frequency switch to cut off the bias current of a final transistor, thereby enabling the efficiency to be improved.

Furthermore, the initial current of the amplifier itself of each stage is reduced so that the amplifier operates in a manner similar to that of Class B, whereby the efficiency at a low output power can be improved. In this case, although distortion of a higher degree appears in the amplifiers, predistortion compensation is performed by using transistors of the high-frequency switch in the bypass circuit. Therefore, a power amplifier can be realized in which the initial current is low in level and an unnecessary current is interrupted at a low output power can be realized without increasing the circuit scale.

DESCRIPTION OF THE REFERENCE NUMERALS AND SIGNS

Figure 1:
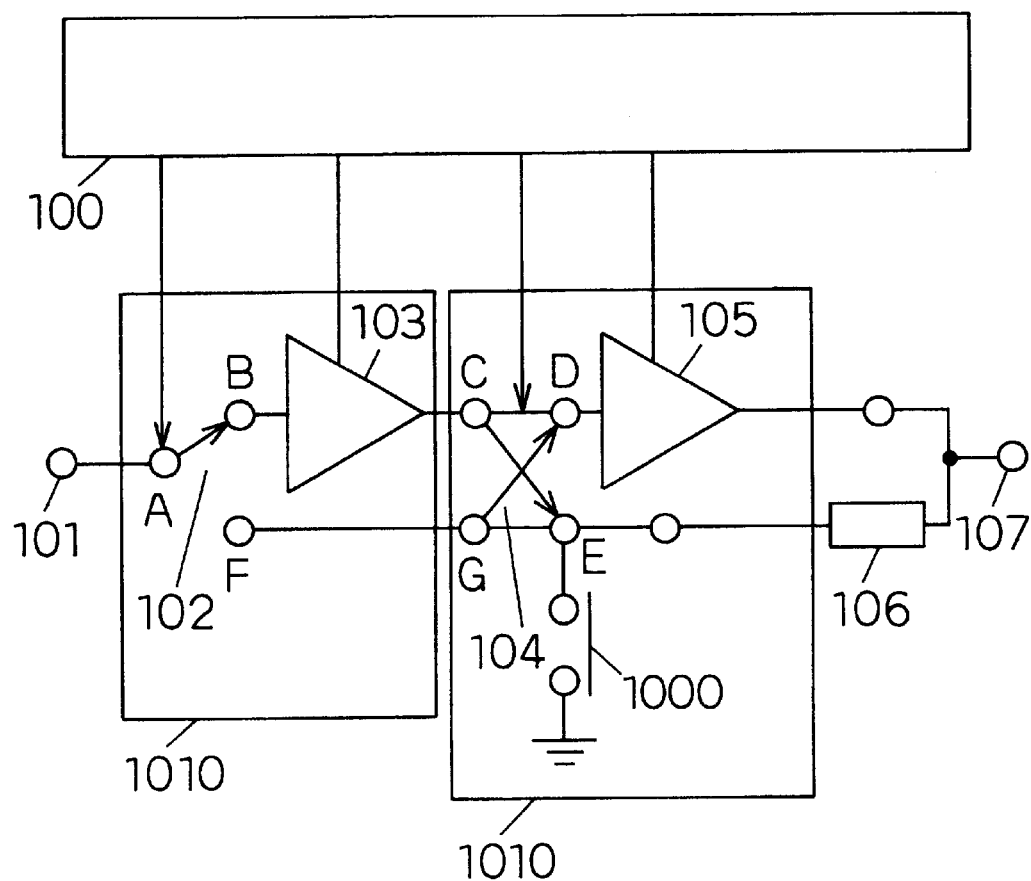
FIG. 1 is a block diagram of a power amplifier of a first embodiment of the invention.

100, 300, 400, 610 bias control circuit
101, 301, 401, 701, 601 input terminal
102, 302, 402, 602 first high-frequency switch circuit
103, 303, 403, 702 preamplifier
104, 304, 404, 605 second high-frequency switch circuit
105, 307, 405, 703 postamplifier
106, 308, 406 quarter wavelength line (impedance conversion circuit)

107, 309, 407, 609, 704 output terminal
305 middle amplifier
306 third high-frequency switch circuit
408 first predistortion circuit
409 second predistortion circuit
603 amplifier
606 first final amplifier
607 second final amplifier
608 transmission line (impedance conversion circuit)
1010 amplification circuit

PREFERRED EMBODIMENTS OF THE INVENTION

Hereinafter, embodiments of the power amplifier of the invention will be described with reference to the accompanying drawings.

Embodiment 1

A first embodiment of the invention will be described with reference to FIGS. 1 and 2. FIG. 1 is a block diagram of a power amplifier of the first embodiment. The reference numeral 100 denotes a bias control circuit, 101 denotes an input terminal, 102 denotes a first high-frequency switch circuit which switches one input to two outputs, 103 denotes a preamplifier, 104 denotes a second high-frequency switch circuit which independently switches two inputs to two outputs, 105 denotes a postamplifier, 106 denotes a quarter wavelength line (impedance conversion circuit), and 107 denotes an output terminal. The amplification circuit 1010 according to the invention is a combination of the high-frequency switch circuits and the amplifiers.

In the power amplifier of the embodiment, when the maximum power must be output, connection between A and B is made in the first high-frequency switch circuit 102, and connection between C and D is made in the second switch. At this time, the impedance of a terminal E of the second switch is short-circuited (or set to be low), whereby the impedance when seeing the terminal E from an output terminal of the postamplifier 105 via the quarter wavelength line 106 is converted into open (high impedance). In FIG. 1, 1000 denotes a switch for causing the short circuit.

According to this configuration, a signal which is input via the input terminal 101 is amplified by the preamplifier 103, and then further amplified by the postamplifier 105. An output signal of the postamplifier is output to the output terminal 107.

When the output power is reduced from the maximum point by a degree corresponding to the gain of the postamplifier, connection between C and E is made in the second high-frequency switch circuit 104 while maintaining the connection between A and B in the first high-frequency switch circuit 102 of FIG. 1. The bias current of the postamplifier 105 is then interrupted by the bias control circuit 100.

At this time, the bias control circuit performs the bias control so that the impedance when seeing the output of the postamplifier 105 from the point where the quarter wavelength line 106 is connected to the output terminal 107 is set to be high.

Therefore, the signal which is input via the input terminal 101 is amplified by the preamplifier 103, and then bypasses around the postamplifier 105 to be transmitted to the output terminal 107 via the quarter wavelength line 106.

When the output power is further reduced by a degree corresponding to the gain of the preamplifier, connection between A and F is made in the first high-frequency switch circuit 102, and connection between G and E is made in the second high-frequency switch circuit 102. The bias currents of the preamplifier 103 and the postamplifier 105 are then interrupted by the bias control circuit 100. Therefore, the signal which is input via the input terminal 101 bypasses around the preamplifier 103 and the postamplifier 105 to be transmitted to the output terminal 107.

Figure 2:
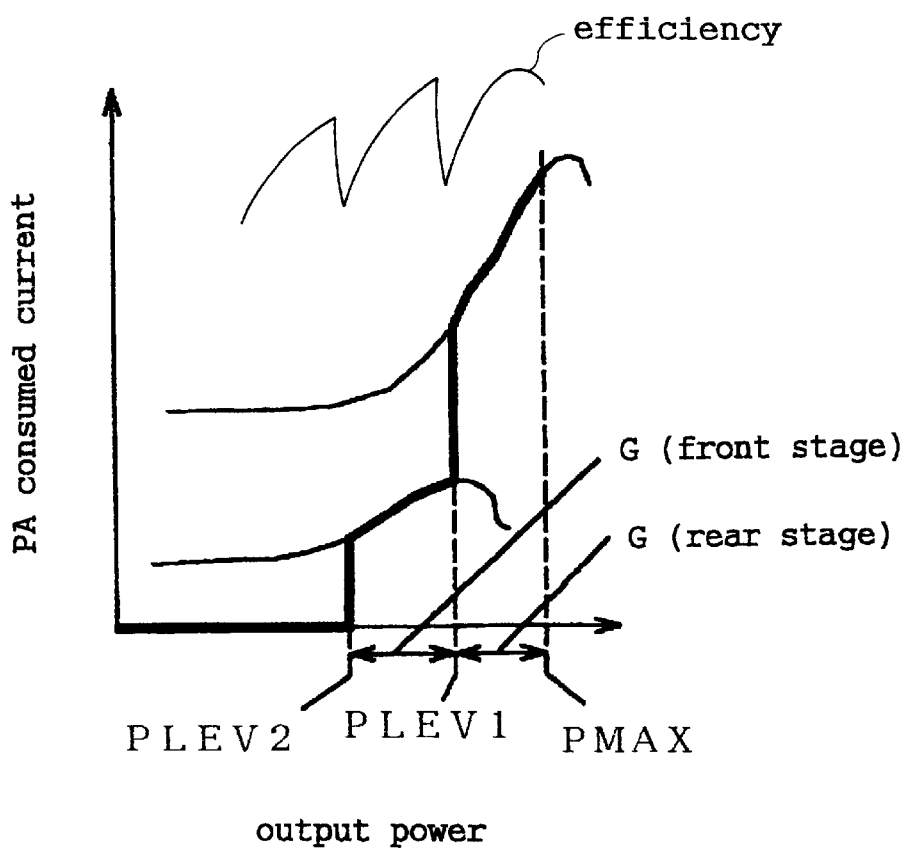
FIGS. 2(a) and 2(b) are graphs illustrating the operation of the power amplifier of the first embodiment.
Figure 2:
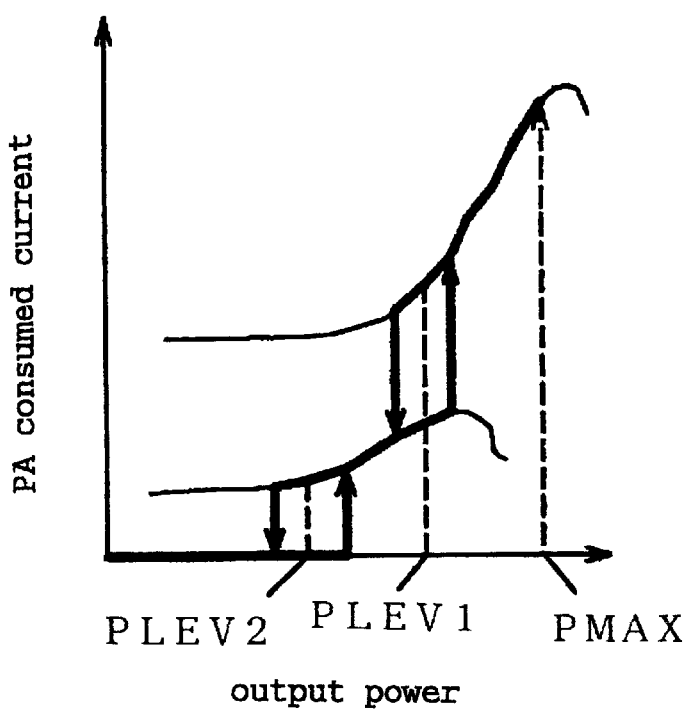

FIG. 2 shows variations of the consumed current with respect to the output power of the power amplifier. When the power amplifier operates as described above, the power amplifier has consumed current characteristics indicated by the thick line in FIG. 2(a). Namely, the consumed current can be largely reduced as compared with the case where the amplifiers are not bypassed.

In the figure, PMAX indicates the maximum transmission power, PLEV1 indicates "PMAX—the gain of the postamplifier", and PLEV2 indicates "PLEV1—the gain of preamplifier".

At each boundary where the bypassing operation on one or both of the preamplifier and the postamplifier is to be started or stopped, as shown in FIG. 2(b), the value of the power at which the transmission power is reduced and the bypassing operation is started may be shifted from that of the power at which the transmission power is increased and the bypassing operation is stopped. In this configuration, the switching frequency of the bypassing operation can be reduced.

Embodiment 2

Figure 3:
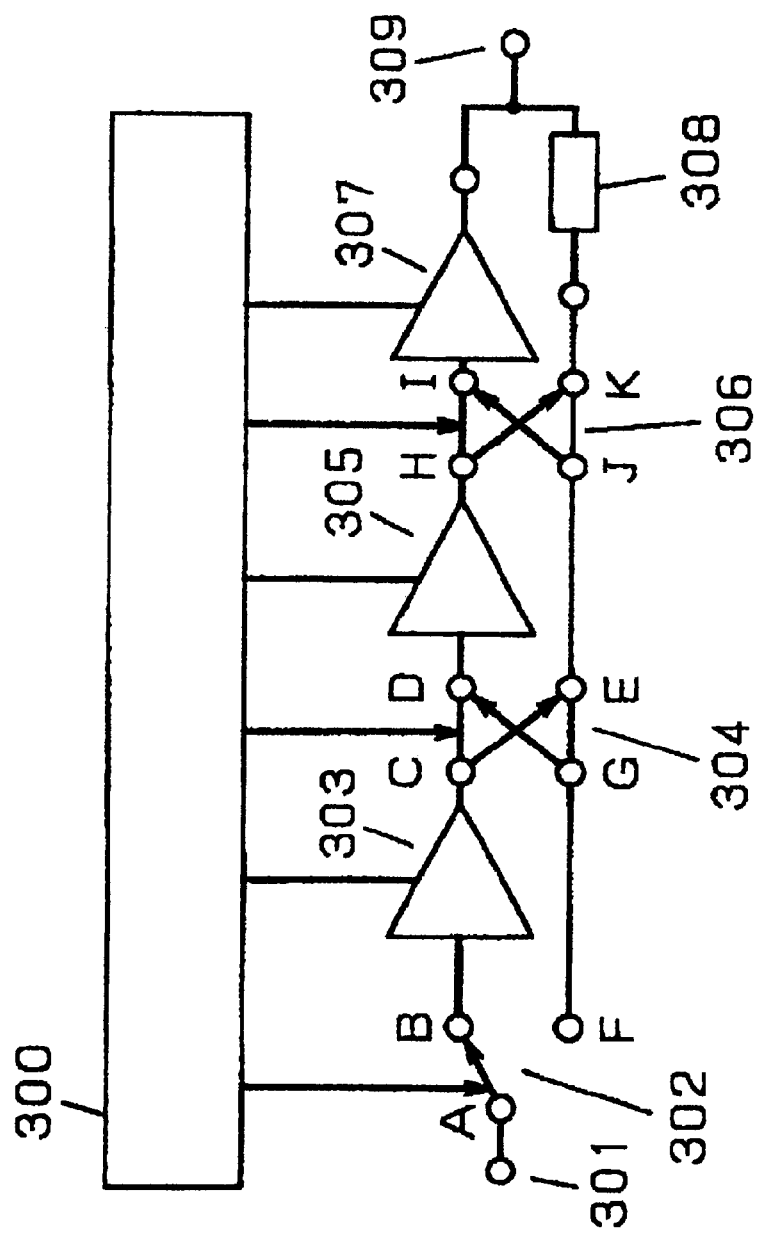
FIG. 3 is a block diagram of a power amplifier of a second embodiment.

A second embodiment of the invention will be described with reference to FIG. 3. FIG. 3 is a block diagram of a power amplifier of the second embodiment. The reference numeral 300 denotes a bias control circuit, 301 denotes an input terminal, 302 denotes a first high-frequency switch circuit which switches one input to two outputs, 303 denotes a preamplifier, 304 denotes a second high-frequency switch circuit which independently switches two inputs to two outputs, 305 denotes a middle amplifier, 306 denotes a third high-frequency switch circuit which independently switches two inputs to two outputs, 307 denotes a postamplifier, 308 denotes a quarter wavelength line, and 309 denotes an output terminal.

The power amplifier of the second embodiment of the invention is configured by: the input terminal 301; the first high-frequency switch circuit 302 which switches a signal input via the input terminal 301 to two outputs; the first amplifier (preamplifier) 303 which is connected to one of the outputs of the first high-frequency switch circuit 302; the second high-frequency switch circuit 304 which independently switches two inputs respectively connected to an output of the first amplifier 303 and the other output of the first high-frequency switch circuit 302, to two outputs; the second amplifier (middle amplifier) 305 which is connected to one of the outputs of the second high-frequency switch circuit 304; the third high-frequency switch circuit 306 which independently switches two inputs respectively connected to an output of the second amplifier 305 and the other output of the second high-frequency switch circuit 304, to two outputs; the third amplifier (postamplifier) 307 which is connected to one of the outputs of the third high-frequency switch circuit 306; the quarter wavelength line 308 which is connected to the other output of the third high-frequency switch circuit 306; and the bias control circuit 300 which controls the power source voltages of the first, second, and third amplifiers 303, 305, and 307.

Figure 4:
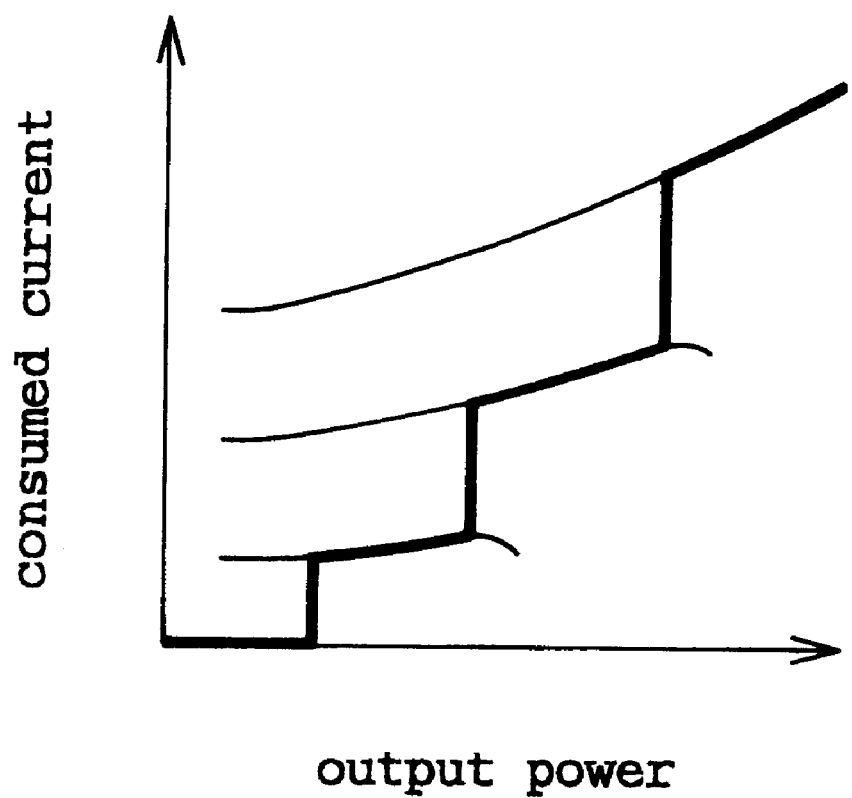
FIG. 4 is a graph illustrating the operation of the power amplifier of the second embodiment.

In the embodiment, the first embodiment is modified so that the bypass circuit is expanded to an amplifier of a lower transmission power. When the embodiment is operated in a similar manner as the first embodiment, the consumed current can be reduced as shown in FIG. 4.

It is apparent that, when the transmission power is further reduced, the consumed current can be further reduced by disposing another bypass circuit in a more preceding stage in the same procedure. In other words, amplification circuits 1010 (combinations of a high-frequency switch circuit and an amplifier) can be connected at any N stages.

Embodiment 3

Figure 5:
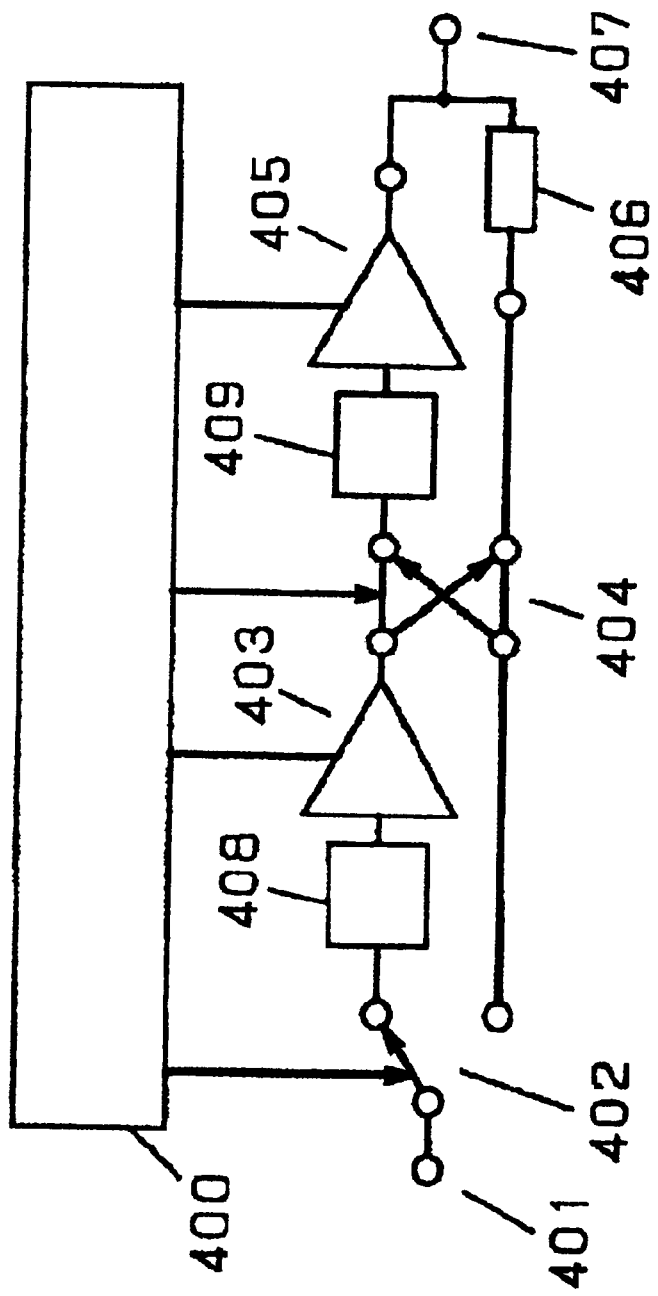
FIG. 5 is a block diagram of a power amplifier of a third embodiment.

A third embodiment of the invention will be described with reference to FIG. 5. FIG. 5 is a block diagram of a power amplifier of the third embodiment. The reference numeral 400 denotes a bias control circuit, 401 denotes an input terminal, 402 denotes a first high-frequency switch circuit which switches one input to two outputs, 403 denotes a preamplifier, 404 denotes a second high-frequency switch circuit which independently switches two inputs to two outputs, 405 denotes a postamplifier, 406 denotes a quarter wavelength line, 407 denotes an output terminal, 408 denotes a first predistortion circuit which previously compensates distortion generated in the preamplifier, and 409 denotes a second predistortion circuit which previously compensates distortion generated in the postamplifier.

The power amplifier of the third embodiment of the invention is characterized in that, in addition to the configuration of the first embodiment, the first predistortion circuit (first predistortion compensation circuit) 408 is disposed between the first high-frequency switch circuit 402 and the first amplifier (preamplifier) 403, and the second predistortion circuit (second predistortion compensation circuit) 409 is disposed between the second high-frequency switch circuit 404 and the second amplifier (postamplifier) 405.

The first and second predistortion circuits of FIG. 5 previously correct one or both of amplitude distortion and phase distortion of the preamplifier and the postamplifier, whereby nonlinear distortion of the whole of the amplifier can be reduced.

At this time, the initial currents of the amplifiers can be reduced by an amount corresponding to the improved degree of the distortion. In this case, even in a range where the bypass circuit is not switched, reduction of the consumed current in a reduced transmission power can be realized. It is a matter of course that an unnecessary current can be reduced by the bias control same as that described in the first embodiment.

The predistortion compensation circuits are placed in front of the first and second amplifiers, respectively. Even when a predistortion compensation circuit is used only for one of the amplifiers, it is possible to reduce nonlinear distortion of the whole of the amplifier.

In the above, the example in which predistortion compensation circuits are used in the configuration of the power amplifier of the first embodiment has been described. Also when predistortion compensation circuits are used in the power amplifier of the second embodiment, nonlinear distortion of the whole of the amplifier can be similarly reduced.

Embodiment 4

Figure 6:
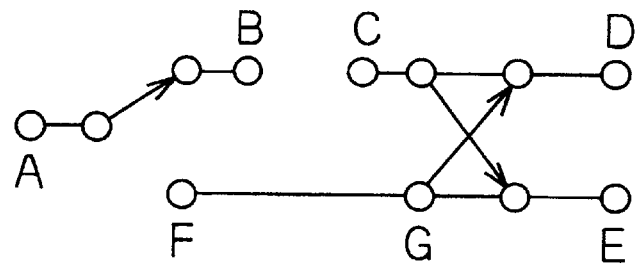
FIG. 6(a) is a block diagram of a high-frequency switch section of a power amplifier of a fourth embodiment.
FIG. 6(b) is a circuit diagram of the high-frequency switch section of the power amplifier of the fourth embodiment.
FIG. 6(c) is a circuit diagram of a further improved high-frequency switch section.
Figure 6:
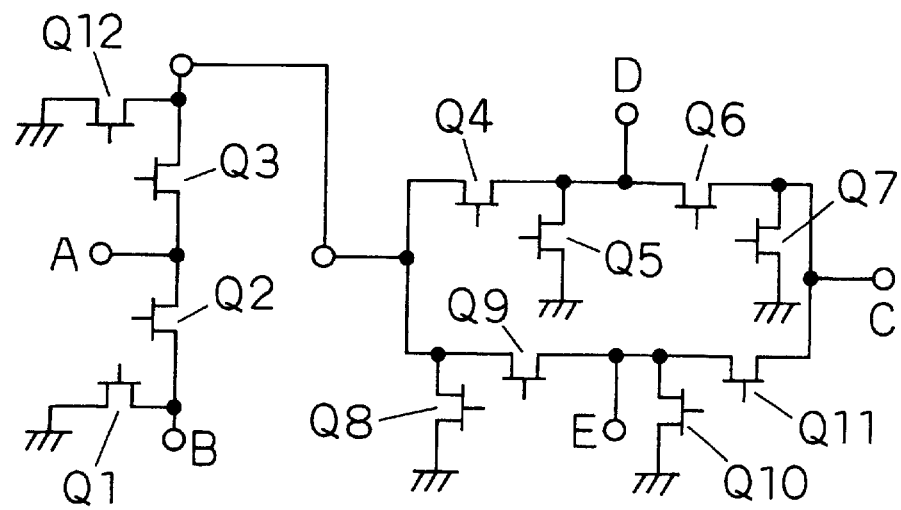
Figure 6:
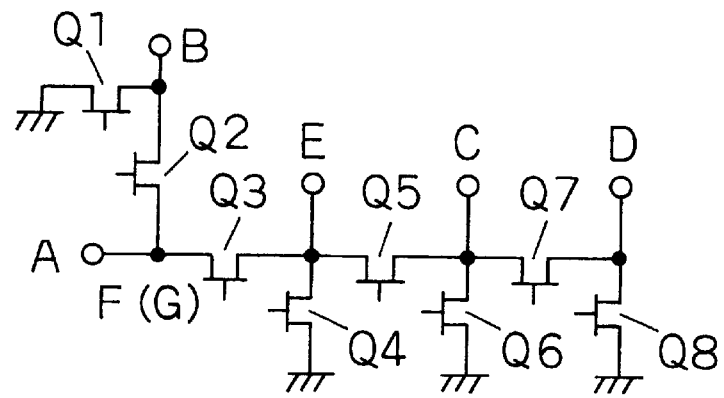

A fourth embodiment of the invention will be described with reference to FIG. 6. FIG. 6 is a block diagram of a power amplifier of the fourth embodiment. FIG. 6 shows the high-frequency switch circuit of the first embodiment. In the figure, (a) is a block diagram of the circuit, (b) is a diagram of the circuit, (c) is a diagram of a circuit which is an improvement of the circuit of (b), and A to E denote terminals of the high-frequency switch circuit. In order to simplify the description, each of transistors Q1 to Q8 in FIG. 6(c), and transistors Q1 to Q12 in FIG. 6(b) is shown in a state where the gate terminal is opened. Actually, however, the gate terminal is connected to the bias control circuit via a serial protection resistor and a parallel bypass capacitor for reducing noise components.

In the high-frequency switch circuit of (c), the number of transistors can be decreased by four as compared with the switch configuration of (b), and therefore the circuit can be miniaturized, thereby enabling the circuit to be easily integrated into an IC.

The high-frequency switch circuit shown in FIG. 6(c) comprises: the first input terminal A; the first transistor Q2 in which one of the drain and the source is connected in series to the first input terminal A, the first output terminal B being connected to the other one of the drain and the source of the first transistor Q2, one of the drain and the source of the second transistor Q1 in which the other one of the drain and the source is grounded in a high-frequency manner being connected to the first output terminal B; the third transistor Q3 in which one of the drain and the source is connected in series to the first input terminal A, the second output terminal E being connected to the other one of the drain and the source of the third transistor Q3, one of the drain and the source of the fourth transistor Q4 in which the other one of the drain and the source is grounded in a high-frequency manner being connected to the second output terminal E; the fifth transistor Q5 in which one of the drain and the source is connected in series to the second output terminal E, the second input terminal C being connected to the other one of the drain and the source of the fifth transistor Q5, one of the drain and the source of the sixth transistor Q6 in which the other one of the drain and the source is grounded in a high-frequency manner being connected to the second input terminal C; and the seventh transistor Q7 in which one of the drain and the source is connected in series to the second input terminal C, the third output terminal D being connected to the other one of the drain and the source of the seventh transistor Q7, one of the drain and the source of the eighth transistor Q8 in which the other one of the drain and the source is grounded in a high-frequency manner being connected to the third output terminal D.

In the circuit, when voltages applied to the gate terminals of the transistors are controlled as shown in Table 1 below, the effects described in the first embodiment are attained.

TABLE 1

| state of transmission power | Q1 | Q2 | Q3 | Q4 | Q5 | Q6 | Q7 | Q8 |
|---|---|---|---|---|---|---|---|---|
| PLEV1~PMAX | L | H | L | H | L | L | H | L |
| PLEV2~PLEV1 | L | H | L | L | H | L | L | H |
| PLEV2 or lower | H | L | H | L | L | H | L | H |

PMAX: maximum transmission power
PLEV1: PMAX - gain of postamplifier
PLEV2: PLEV1 - gain of preamplifier
H: potential at which transistor is conductive
L: potential at which transistor is nonconductive When at least one of the transistors Q1 and Q2 is appropriately biased so as to perform a predistortion operation, the effects of the third embodiment can be attained without adding a special predistortion circuit.

Similarly, when at least one of the transistors Q6, Q7, and Q8 is appropriately biased so as to perform a predistortion operation, the effects of the third embodiment can be attained without involving a special predistortion circuit.

Embodiment 5

Figure 7A:
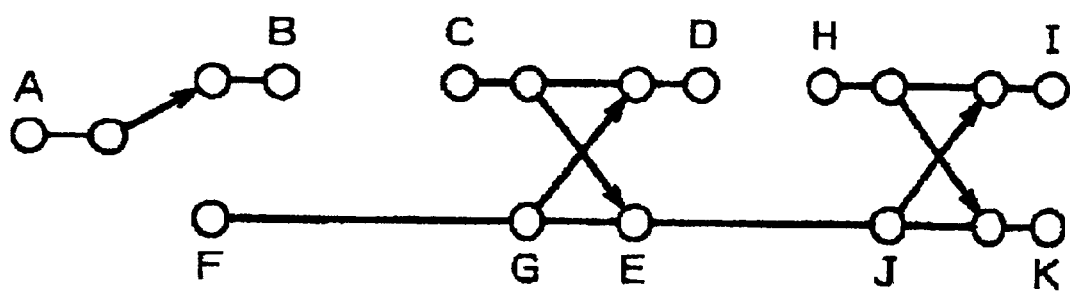
FIG. 7(a) is a block diagram of a high-frequency switch section of a power amplifier of a fifth embodiment.

A fifth embodiment of the invention will be described with reference to FIG. 7. FIG. 7 is a block diagram of a power amplifier of the fifth embodiment. FIG. 7 shows the high-frequency switch circuit of the second embodiment. In the figure, (a) is a block diagram of the circuit, (b) is a diagram of the circuit, and A to K denote terminals of the switch circuit.

Figure 7B:
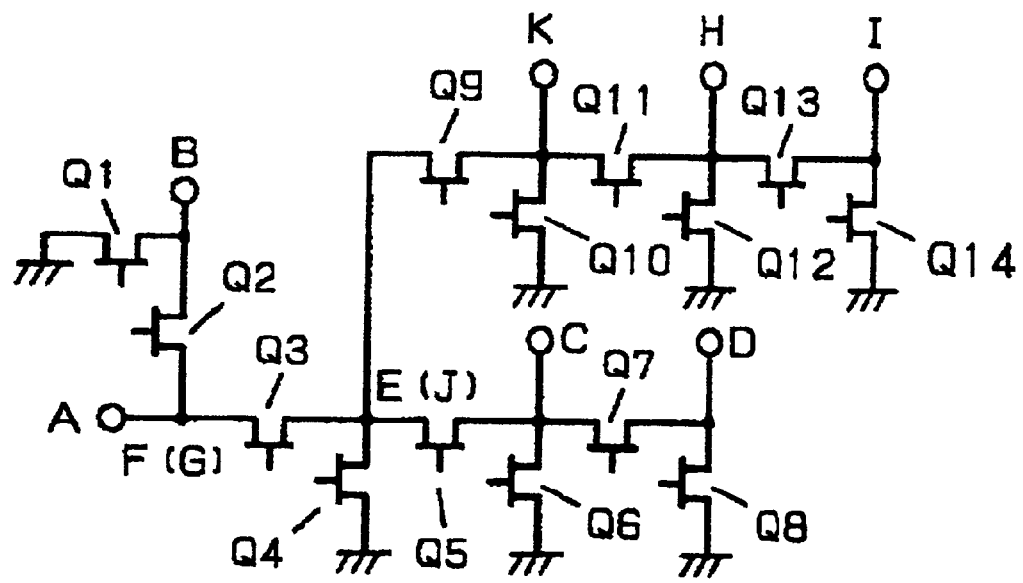
FIG. 7(b) is a circuit diagram of the high-frequency switch section of the power amplifier of the fifth embodiment.

In order to simplify the description, each of transistors Q1 to Q14 in FIG. 7(b) is shown in a state where the gate terminal is opened. Actually, however, the gate terminal is connected to the bias control circuit via a serial protection resistor and a parallel bypass capacitor for reducing noise components. In the same manner as the fourth embodiment, the number of transistors in the circuit can be decreased by six as compared with the conventional configuration, and the circuit can be miniaturized, thereby enabling the circuit to be easily integrated into an IC. The conventional configuration is for example such circuit that the circuit part of Q1 to Q11 in FIG. 6(b) is added to the whole circuit of the FIG. 6(b) while the output terminal E is connected with the input terminal of said added part circuit. The number of the transistors in the conventional configuration is 20 but the FIG. 7(b) is only 14 and the six transistors can be reduced.

The high-frequency switch circuit shown in FIG. 7(b) comprises: the first input terminal A; the first transistor Q2 in which one of the drain and the source is connected in series to the first input terminal A, the first output terminal B being connected to the other one of the drain and the source of the first transistor Q2, one of the drain and the source of the second transistor Q1 in which the other one of the drain and the source is grounded in a high-frequency manner being connected to the first output terminal B; the third transistor Q3 in which one of the drain and the source is connected in series to the first input terminal A, one of the drain and the source of the fourth transistor Q4 in which the other one of the drain and the source is grounded in a high-frequency manner being connected to the other one of the drain and the source of the third transistor Q3; the fifth transistor Q5 in which one of the drain and the source is connected in series to the other one of the drain and the source of the third transistor Q3, the second input terminal C being connected to the other one of the drain and the source of the fifth transistor Q5, one of the drain and the source of the sixth transistor Q6 in which the other one of the drain and the source is grounded in a high-frequency manner being connected to the second input terminal C; the seventh transistor Q7 in which one of the drain and the source is connected in series to the second input terminal C, the second output terminal D being connected to the other one of the drain and the source of the seventh transistor Q7, one of the drain and the source of the eighth transistor Q8 in which the other one of the drain and the source is grounded in a high-frequency manner being connected to the second output terminal D; the ninth transistor Q9 in which one of the drain and the source is connected in series to the other one of the drain and the source of the third transistor Q3, the third output terminal K being connected to the other one of the drain and the source of the ninth transistor Q9, one of the drain and the source of the tenth transistor Q10 in which the other one of the drain and the source is grounded in a high-frequency manner being connected to the third output terminal K; the eleventh transistor Q11 in which one of the drain and the source is connected in series to the third output terminal K, the third input terminal H being connected to the other one of the drain and the source of the eleventh transistor Q11, one of the drain and the source of the twelfth transistor Q12 in which the other one of the drain and the source is grounded in a high-frequency manner being connected to the third input terminal H; and the thirteenth transistor Q13 in which one of the drain and the source is connected in series to the third input terminal H, the fourth output terminal I being connected to the other one of the drain and the source of the thirteenth transistor Q13, one of the drain and the source of the fourteenth transistor Q14 in which the other one of the drain and the source is grounded in a high-frequency manner being connected to the fourth output terminal I.

In the circuit, when voltages applied to the gate terminals of the transistors are controlled as shown in Table 2 below, the effects described in the third embodiment are attained.

TABLE 2

| state of transmission power | Q1 | Q2 | Q3 | Q4 | Q5 | Q6 | Q7 |
|---|---|---|---|---|---|---|---|
| PLEV1~PMAX | L | H | L | H | L | L | H |
| PLEV2~PLEV1 | L | H | L | H | L | L | H |
| PLEV3~PLEV2 | L | H | L | L | H | L | L |
| PLEV3 or lower | H | L | H | L | L | H | L |

| state of transmission power | Q8 | Q9 | Q10 | Q11 | Q12 | Q13 | Q14 |
|---|---|---|---|---|---|---|---|
| PLEV1~PMAX | L | L | H | L | L | H | L |
| PLEV2~PLEV1 | L | L | L | H | L | L | H |
| PLEV3~PLEV2 | H | H | L | L | H | L | H |
| PLEV3 or lower | H | H | L | L | H | L | H |

PMAX: maximum transmission power
PLEV1: PMAX - gain of postamplifier
PLEV2: PLEV1 - gain of middle amplifier
PLEV3: PLEV2 - gain of preamplifier
H: potential at which transistor is conductive
L: potential at which transistor is nonconductive When at least one of the transistors Q1 and Q2 is appropriately biased so as to perform a predistortion operation, the effects of the third embodiment can be attained without involving a predistortion circuit. Similarly, when at least one of the transistors Q6, Q7, and Q8 is appropriately biased so as to perform a predistortion operation, the effects of the third embodiment can be attained without involving a predistortion circuit.

Similarly, when at least one of the transistors Q12, Q13, and Q14 is appropriately biased so as to perform a predistortion operation, the effects of the third embodiment can be attained without involving a predistortion circuit.

Embodiment 6

Figure 8:
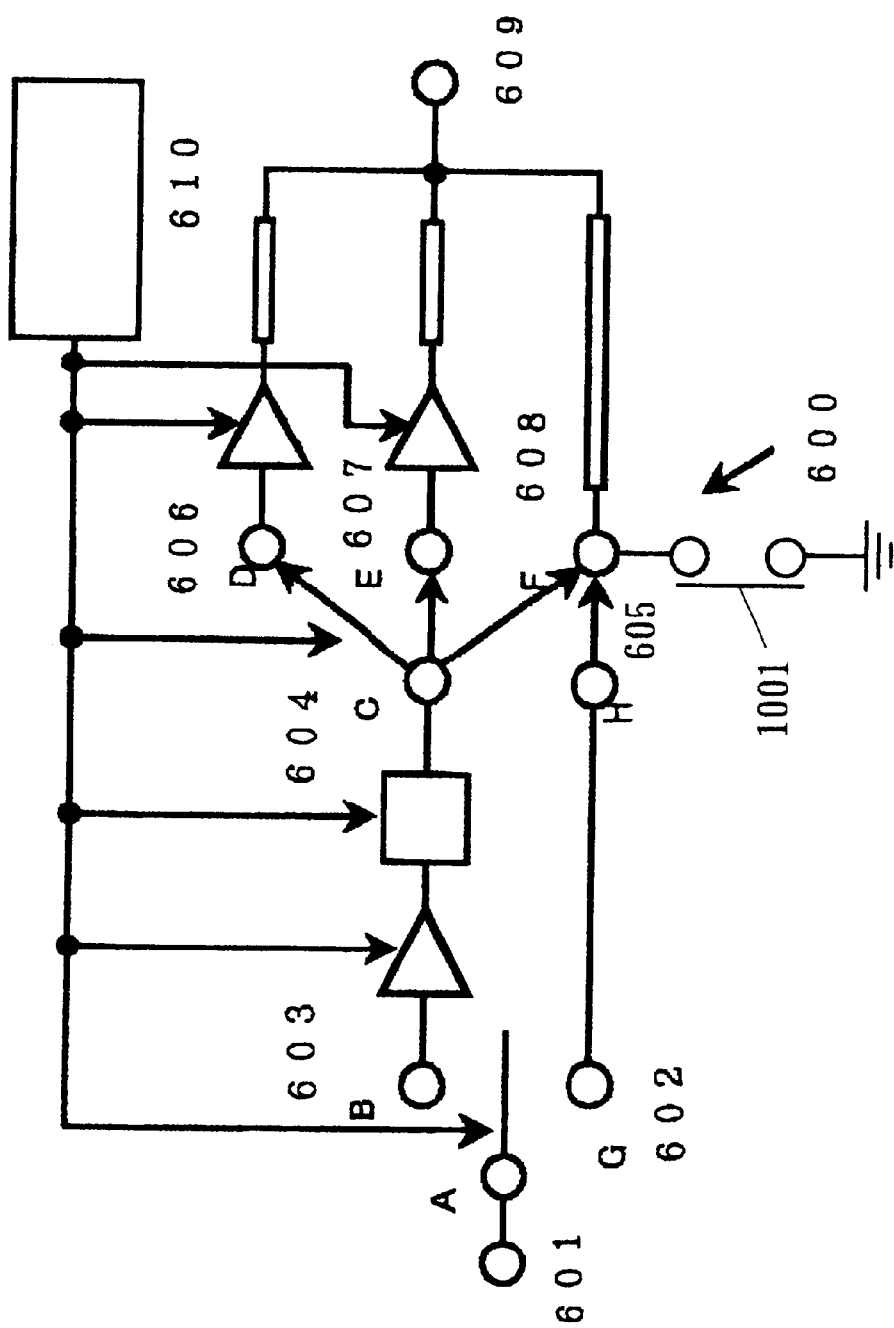
FIG. 8 is a block diagram of a power amplifier of a sixth embodiment.

A sixth embodiment of the invention will be described with reference to FIGS. 8 and 9. FIG. 8 is a block diagram of a power amplifier 600 according to the invention. The reference numeral 601 denotes an input terminal, 602 denotes a first high-frequency switch which switches one input to two outputs, 603 denotes an amplifier, 604 denotes impedance switching means, 605 denotes a second high-frequency switch which switches two inputs to three outputs, 606 denotes a first final amplifier, 607 denotes a second final amplifier, 608 denotes a transmission line, 609 denotes an output terminal, and 610 denotes a bias control circuit.

When the maximum power must be output, the power amplifier of the sixth embodiment causes the first high-frequency switch 601 of FIG. 8 to make connection between A and B, and the second high-frequency switch 605 to make connection among C, D, and E. At this time, the impedance of a terminal F of the second high-frequency switch 605 is short-circuited to be lowered, by closing a switch 1001, whereby the impedance when seeing the terminal from outputs of the first and second final amplifiers 606 and 607 via the transmission line 608 is converted into an open-circuit impedance (high impedance).

According to this configuration, a signal which is input via the input terminal 601 is amplified by the amplifier 603, and then further amplified by the first and second final amplifiers 606 and 607. Output signals of the final amplifiers are output to the output terminal 609. At this time, since the first and second final amplifiers 606 and 607 are connected to each other in parallel and the circuits have usually the same characteristic impedance, matching is attained by using the impedance switching means 604.

When the transmission power is made sufficient by the amplifier 603 and the first final amplifier 606, connection between C and D is made in the second high-frequency switch 605 while maintaining the connection between A and B in the first high-frequency switch 602.

At this time, the control circuit 610 performs a control so that the bias current of the second final amplifier 607 is interrupted, a bias is given so as to set the impedance when seeing the output of the second final amplifier 607 from the point where the first final amplifier 606 is connected to the output terminal 609 to be high, and the impedance switching means 604 is turned off. Therefore, the signal which is input via the input terminal 601 is amplified by the amplifier 603, the amplified signal is further amplified by the first final amplifier 606, and an output signal of the amplifier is output to the output terminal 609.

When the transmission power is made sufficient by the amplifier 603 and the second final amplifier 607, connection between C and E is made in the second high-frequency switch 605 while maintaining the connection between A and B in the first high-frequency switch 602.

At this time, the control circuit 610 performs a control so that the bias current of the second final amplifier 607 is interrupted, a bias is given so as to set the impedance when seeing the output of the first final amplifier 606 from the point where the second final amplifier 607 is connected to the output terminal 609 to be high, and the impedance switching means 604 is turned off. Therefore, the signal which is input via the input terminal 601 is amplified by the amplifier 603, the amplified signal is further amplified by the second final amplifier 607, and an output signal of the amplifier is output to the output terminal 609.

When the output power is further reduced by a degree corresponding to the gains of the final amplifiers, connection between C and F is made in the second high-frequency switch 605 while maintaining the connection between A and B in the first high-frequency switch 602.

At this time, the control circuit 610 performs a control so that the bias currents of the first and second final amplifiers 606 and 607 are interrupted, a bias is given so as to set the impedances when seeing the outputs of the first second final amplifiers 606 and 607 from the point where the transmission line 608 is connected to the output terminal 609 to be high, and the impedance switching means 604 is turned off. Therefore, the signal which is input via the input terminal 601 is amplified by the amplifier 603, and the amplified signal bypasses around the final amplifiers 606 and 607, and then output to the output terminal 609 via the transmission line 608.

When the output power is further reduced by a degree corresponding to the gain of the amplifier 603, connection between A and G is made in the first switch 602, and connection between H and F is made in the second switch 605. At this time, the control circuit 610 performs a control so that the bias currents of the first and second final amplifiers 606 and 607 are interrupted, a bias is given so as to set the impedances when seeing the outputs of the first second final amplifiers 606 and 607 from the point where the transmission line 608 is connected to the output terminal 609 to be high, and the impedance switching means 604 is turned off. Therefore, the signal which is input via the input terminal 601 bypasses around the amplifier 603 and the final amplifiers, and then output to the output terminal 609 via the transmission line 608.

Figure 9:
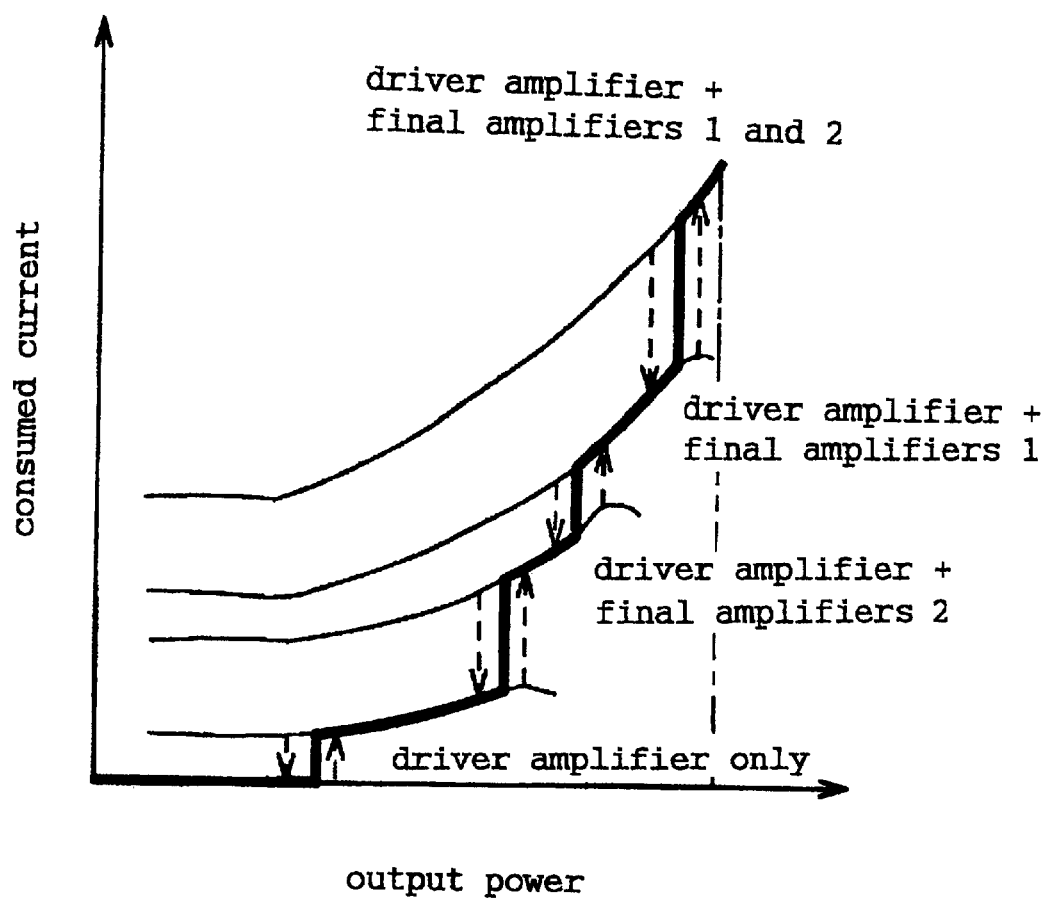
FIG. 9 is a view illustrating the operation of the power amplifier of the sixth embodiment.

FIG. 9 shows variations of the consumed current with respect to the output power of the power amplifier of the sixth embodiment in the case where the first and second final amplifiers 606 and 607 have different characteristics.

When the power amplifier operates as described above, the power amplifier has consumed current characteristics indicated by the thick line in FIG. 9. Namely, the consumed current can be largely reduced as compared with the case where the amplifiers are not bypassed.

In the case where the first and second final amplifiers 606 and 607 have the same characteristics, the efficiency at an output power which is lower by 3 dB than the maximum output power may be made equal to that at the maximum output power.

As indicated by the broken lines in FIG. 9, the value of the transmission power at the timing of the bypass switching in the case where the transmission power is increasing may be shifted from that in the case where the transmission power is decreasing, whereby the switching frequency of the bypass switching operation can be reduced.

Embodiment 7

Figure 10A:
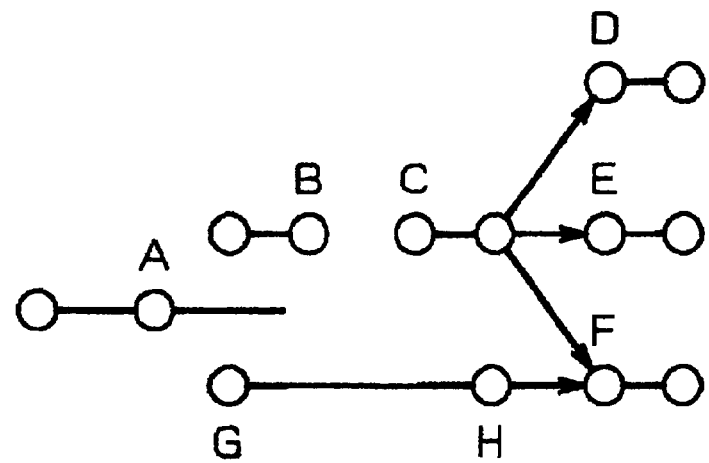
FIG. 10(a) is a block diagram of a high-frequency switch section of a power amplifier of a seventh embodiment.
Figure 10B:
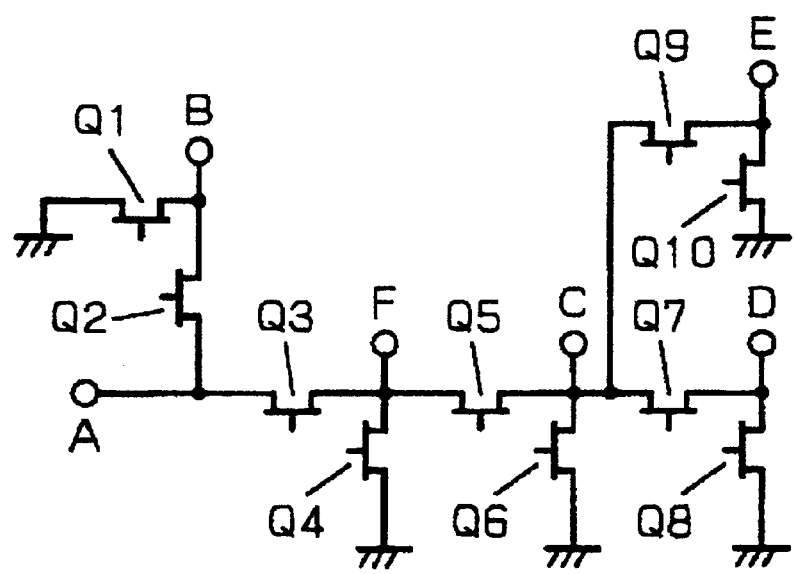
FIG. 10(b) is a circuit diagram of high-frequency switch section of the power amplifier of the seventh embodiment.

FIG. 10 shows the switches_ in FIG. 8 showing the power amplifier of the sixth embodiment. In the figure, (a) is a block diagram of the switches, and (b) is a circuit diagram of the switches. The symbols of the terminals correspond to those of FIG. 8. In order to simplify the description, each of transistors Q1 to Q10 in FIG. 10(*b*) is shown in a state where the gate terminal is opened. Actually, however, the gate terminal is connected to the control circuit via a serial protection resistor and a parallel bypass capacitor for reducing noise components.

The high-frequency switch circuit shown in FIG. 10(*b*) comprises: the first input terminal A; the first transistor Q2 in which one of the drain and the source is connected in series to the first input terminal A, the first output terminal B being connected to the other one of the drain and the source of the first transistor Q2, one of the drain and the source of the second transistor Q1 in which the other one of the drain and the source is grounded in a high-frequency manner being connected to the first output terminal B; the third transistor Q3 in which one of the drain and the source is connected in series to the first input terminal A, the second output terminal F being connected the other one of the drain and the source of the third transistor Q3, one of the drain and the source of the fourth transistor Q4 in which the other one of the drain and the source is grounded in a high-frequency manner being connected to the second output terminal F; the fifth transistor Q5 in which one of the drain and the source is connected in series to the second output terminal F, the second input terminal C being connected to the other one of the drain and the source of the fifth transistor Q5, one of the drain and the source of the sixth transistor Q6 in which the other one of the drain and the source is grounded in a high-frequency manner being connected to the second input terminal C; and the seventh transistor Q7 in which one of the drain and the source is connected in series to the second input terminal C, the third output terminal D being connected to the other one of the drain and the source of the seventh transistor Q7, one of the drain and the source of the eighth transistor Q8 in which the other one of the drain and the source is grounded in a high-frequency manner being connected to the third output terminal D, one of the drain and the source of the ninth transistor Q9 being connected in series to the other one of the drain and the source of the fifth transistor Q5, one of the drain and the source of the tenth transistor Q10 in which the other one of the drain and the source is grounded in a high-frequency manner being connected to the other one of the drain and the source of the ninth transistor Q9, the fourth output terminal E being connected to the other one of the drain and the source of the ninth transistor Q9.

In the circuit, when voltages applied to the gate terminals of the transistors are controlled as shown in Table 3 below, the effects described in the sixth embodiment are attained. When at least one of the transistors Q1 and Q2, and similarly at least one of the transistors Q6, Q7, and Q8, and at least one of the transistors Q6, Q9, and Q10 are appropriately biased, the power amplifier is enabled to perform a predistortion operation without involving a predistortion circuit.

When the power amplifier performs a predistortion operation, nonliner distortion of the whole of the amplifier can be reduced, and the current can be reduced by an amount corresponding to the improved degree of the distortion. In this case, even when the transmission power is lowered in a range where the bypass circuit is not switched, reduction of the consumed current can be realized.

TABLE 3

| driving power amplifier | Q1 | Q2 | Q3 | Q4 | Q5 | Q6 | Q7 | Q8 | Q9 | Q10 |
|---|---|---|---|---|---|---|---|---|---|---|
| driver amplifier + final amplifiers 1 and 2 | L | H | L | H | L | L | H | L | H | L |
| driver amplifier + final amplifiers 1 | L | H | L | H | L | L | H | L | H | L |
| driver amplifier + final amplifiers 2 | L | H | L | H | L | L | L | H | L | H |
| driver amplifier only | L | H | L | L | H | L | L | H | L | H |
| all amplifiers are off | H | L | H | L | L | H | L | H | L | H |

H: potential at which transistor is conductive
H: potential at which transistor is nonconductive It is apparent that the bypass switching control which is described in the sixth embodiment can attain the same effects in the seventh embodiment also.

It is apparent that, even when a part or all of the high-frequency switch circuits and the amplifiers are formed on a same semiconductor substrate, the same effects as those described above can be attained. When the high-frequency switch circuits and the amplifiers are configured on different semiconductor substrates, components which are configured by different materials (for example, gallium arsenide, silicon, and silicon germanium), or different processes (an electric field transistor, a bipolar transistor, and the like) and which have excellent performances can be shared. Therefore, the production cost can be lowered, and miniaturization of a terminal device can be realized as a result of the operation based on a single power source.

Figure 11:
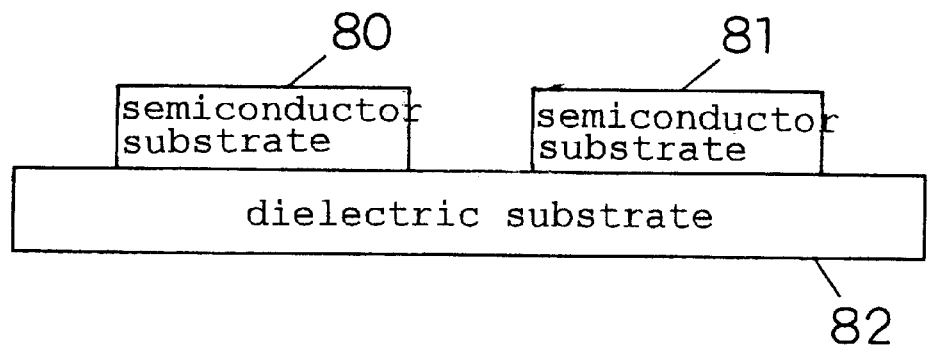
FIG. 11 is a side view of a substrate and its periphery in an embodiment of the invention.
Figure 12:
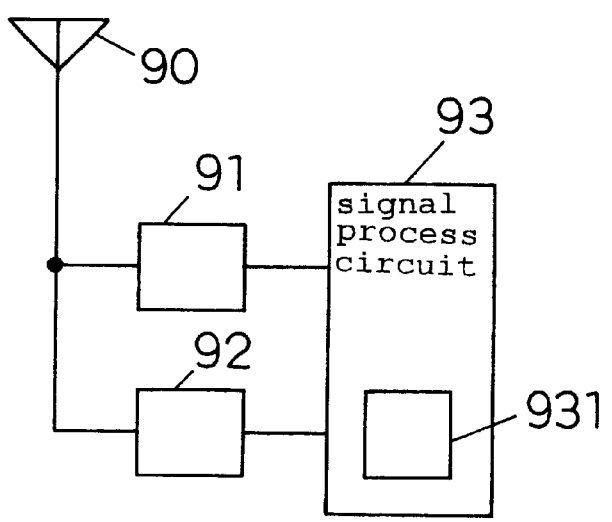
FIG. 12 is a diagram showing the configuration of an embodiment of the communication equipment of the invention.
Figure 13:
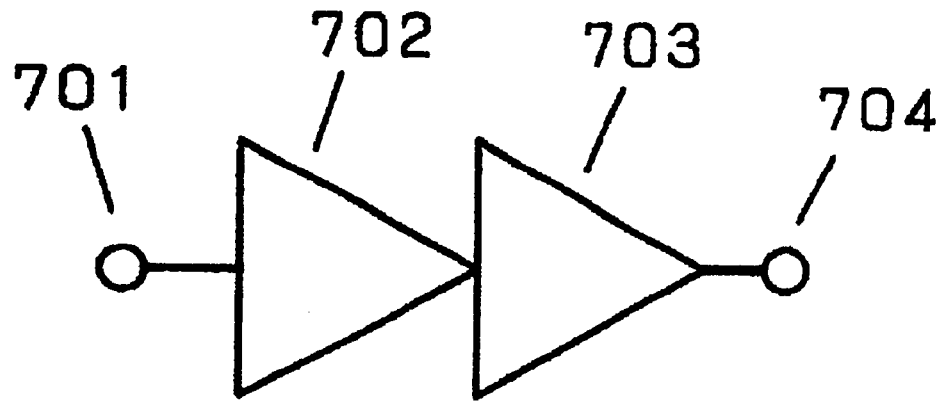
FIG. 13 is a diagram showing the configuration of a power amplifier of the conventional art.
Figure 14:
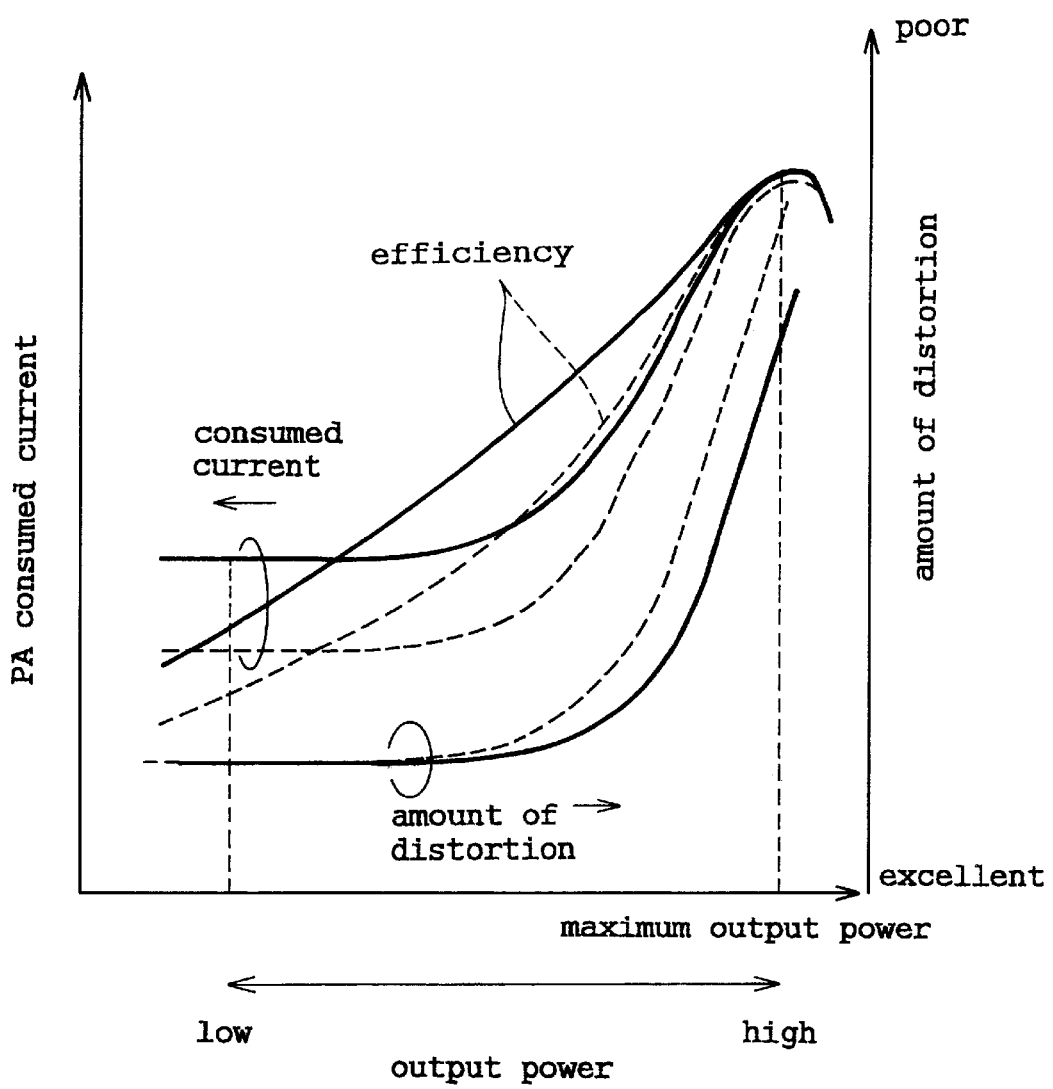
FIG. 14 is a view illustrating the operation of the power amplifier of the conventional art.

In FIG. 11, the above-mentioned high-frequency switch circuits are configured on a first same semiconductor substrate 80, the amplifiers are configured on a second same semiconductor substrate 81, and the first and second semiconductor substrates 80 and 81 are mounted on a same dielectric substrate 82.

It is apparent that, when the switching control in the bypass switching boundaries which has been described only in the first embodiment is performed in accordance with the principle described in the first embodiment, the same effects are attained also in the second to seventh embodiments.

The communication equipment of the invention is a communication equipment which is characterized in that the equipment comprises: a power amplifier 931 according to the invention which has been described above; an antenna 90; a reception circuit 91; a signal process circuit 93 which processes a signal from the reception circuit 91 by using the power amplifier 931; and a transmission circuit 92 which performs a transmission process on a signal supplied from the signal process circuit 93.

EFFECTS OF THE INVENTION

As described above, in the power amplifier of the invention, in accordance with reduction of the transmission power, the amplifier of a higher power is bypassed by the high-frequency switch, and the power source of the bypassed amplifier is cut off, whereby the efficiency in transmission at a low power can be improved. By repeating this operation, the efficiency can be improved in a broad dynamic range in transmission.

Furthermore, the initial current of the amplifier itself of each stage is reduced so that the amplifier operates in a manner similar to that of Class B, whereby the efficiency at a low output power can be improved. In this case, although distortion of a higher degree appears in the amplifiers, predistortion compensation is performed by using transistors of the high-frequency switch in the bypass circuit. Therefore, a power amplifier can be realized in which the initial current is low in level and an unnecessary current is interrupted at a low output power can be realized without increasing the circuit scale.

What is claimed is:

1. A power amplifier comprises: an input terminal; an output terminal; an N number of bypassable amplification circuits which are connected directly or indirectly in a sequential manner between said input terminal and said output terminal; an impedance conversion circuit which is connected directly or indirectly between said amplification circuit of a final stage and said output terminal; and a bias control circuit which controls said amplification circuits, each of said amplification circuits including a high-frequency switch circuit, and an amplifier which is connected directly or indirectly to said switch circuit, said bias control circuit controls power source voltages of said amplifiers and controls status of said switch circuit, each of the amplification circuits sequentially connected to each other and individually bypassable between said input and output terminals, wherein a switch circuit of a respective amplification circuit selectively bypasses the respective amplification circuit by connecting an output signal from a prior adjacent amplification circuit to an input of a next adjacent amplification circuit.

2. A power amplifier comprising: an input terminal; a first high-frequency switch circuit which can output a signal input to said input terminal while switching to two output terminals; a first amplifier which is connected directly or indirectly to one of said output terminals of said first high-frequency switch circuit; a second high-frequency switch circuit which is connected directly or indirectly to an output terminal of said first amplifier and another one of said output terminals of said first high-frequency switch circuit, and which can independently output two signals respectively input from said output terminals while switching to two output terminals; a second amplifier which is connected directly or indirectly to one of said output terminals of said second high-frequency switch circuit; an impedance conversion circuit which is connected directly or indirectly to another one of said output terminals of said second high-frequency switch circuit; an output terminal which is commonly connected directly or indirectly to an output terminal of said second amplifier and an output terminal of said impedance conversion circuit; and a bias control circuit which controls power source voltages of said first and second amplifiers and controls status of said switch circuit.

3. A power amplifier comprising: an input terminal; a first high-frequency switch circuit which can output a signal input to said input terminal while switching to two output terminals; a first amplifier which is connected directly or indirectly to one of said output terminals of said first high-frequency switch circuit; a second high-frequency switch circuit which is connected directly or indirectly to an output terminal of said first amplifier and another one of said output terminals of said first high-frequency switch circuit, and which can independently output two signals respectively input from said output terminals while switching to two output terminals; a second amplifier which is connected directly or indirectly to one of said output terminals of said second high-frequency switch circuit; a third high-frequency switch circuit which is connected directly or indirectly to an output terminal of said second amplifier and another one of said output terminals of said second high-frequency switch circuit, and which can independently output two signals respectively input from said output terminals while switching to two output terminals; a third amplifier which is connected directly or indirectly to one of said output terminals of said third high-frequency switch circuit; an impedance conversion circuit which is connected directly or indirectly to another one of said output terminals of said third high-frequency switch circuit; an output terminal which is commonly connected directly or indirectly to an output terminal of said third amplifier and an output terminal of said impedance conversion circuit; and a bias control circuit which controls power source voltages of said first, second, and third amplifiers and controls status of said switch circuit.

4. A power amplifier comprising: an input terminal; a first high-frequency switch circuit which can output a signal input to said input terminal while switching to two output terminals; a first amplifier which is connected directly or indirectly to one of said output terminals of said first high-frequency switch circuit; impedance switching means which is connected directly or indirectly to an output terminal of said first amplifier; a second high-frequency switch circuit which is connected directly or indirectly to another one of said output terminals of said first high-frequency switch circuit and an output terminal of said impedance switching means, and which can independently output two signals respectively input from said output terminals while switching to three output terminals; a first final amplifier which is connected directly or indirectly to a first one of said output terminals of said second high-frequency switch circuit; a second final amplifier which is connected directly or indirectly to a second one of said output terminals of said second high-frequency switch circuit; a impedance conversion circuit which is connected directly or indirectly to a third one of said output terminals of said second high-frequency switch circuit; an output terminal which is commonly connected directly or indirectly to said first and second final amplifiers, and said impedance conversion circuit; and a bias control circuit which controls power source voltages of said first amplifier, and said first and second final amplifiers, on/off operations of said impedance switching means, and switching operations of said first and second high-frequency switch circuits.

5. A power amplifier according to claim 4, wherein said first and second final amplifiers are power amplifiers having the same characteristics.

6. A power amplifier according to any one of claims 1 to 5, wherein a predistortion compensation circuit is connected to an input of at least one of said amplifiers.

7. A power amplifier according to any one of claims 1 to 5, wherein said high-frequency switch circuits are configured on a same semiconductor substrate.

8. A power amplifier according to any one of claims 1 to 5, wherein said amplifiers are configured on a same semiconductor substrate.

9. A power amplifier according to any one of claims 1 to 5, wherein said high-frequency switch circuits and said amplifiers are configured on a same semiconductor substrate.

10. A power amplifier according to any one of claims 1 to 5, wherein said high-frequency switch circuits are configured on a first same semiconductor substrate, said amplifiers are configured on a second same semiconductor substrate, and said first and second semiconductor substrates are mounted on a same dielectric substrate.

11. A power amplifier according to claim 4, wherein said first amplifier, and said first and second high-frequency switch circuits are configured on a first same semiconductor substrate, said first and second final amplifiers, and said impedance conversion circuit are configured on a second same semiconductor substrate, and said first and second semiconductor substrates are mounted on a same dielectric substrate.

12. A power control method for a power amplifier comprising the steps of:
(a) forming a plurality of amplification stages in which each amplification stage includes an amplifier and an individual high frequency switch circuit;
(b) sequentially connecting each of the plurality of amplification stages to form the power amplifier;
(c) controlling power source voltages of each of the amplifiers and status of each of the switch circuits; and
(d) individually bypassing an amplification stage in the sequentially connected amplification stages formed in step (b) by selectively bypassing a respective amplification stage by connecting an output signal from a prior adjacent amplification stage to an input of a next adjacent amplification stage.

13. A power control method for a power amplifier according to claim 2, wherein
when a transmission power is at a maximum, said bias control circuit performs a control in the following manner:

said first high-frequency switch circuit is switchingly connected to a side of said first amplifier; an input (C) of said second high-frequency switch circuit is connected to said second amplifier (D), said input being on a side of an output of said first amplifier; a power source voltage is supplied both to said first and second amplifiers; an impedance of said second high-frequency switch circuit at a point where said second high-frequency switch circuit is connected to an input of said impedance conversation circuit is set to be low; and an impedance when seeing said impedance conversion circuit from an output of said second amplifier is set to be high, when the transmission power is reduced to be lower than again of said second amplifier, said bias control circuit performs a control in the following manner:
said first high-frequency switch circuit is switchingly connected to the side of said first amplifier; said input (C) of said second high-frequency switch circuit is connected to said impedance conversion circuit (E), said input being on the side of said output of said first amplifier; a power source voltage is supplied only to said first amplifier; the power source voltage for said second amplifier is interrupted; and an impedance when seeing said second amplifier from an output of said impedance conversion circuit is set to be high, and, when the transmission power is further reduced to be lower than a gain of said first amplifier, said bias control circuit performs a control in the following manner:
said first high-frequency switch circuit is switchingly connected to a side of an input terminal (G) of said second high-frequency switch circuit; said second high-frequency switch circuit is switchingly connected to a side of said impedance conversion circuit; both the power source voltages for said first and second amplifiers are interrupted; and an impedance when seeing said second amplifier from said output of said impedance conversion circuit is set to be high.

14. A power control method for a power amplifier according to claim 3, wherein
when a transmission power is at a maximum, said bias control circuit performs a control in the following manner:
said first high-frequency switch circuit is switchingly connected to a side of said first amplifier; an input (C) of said second high-frequency switch circuit is connected to said second amplifier (D), said input being on a side of an output of said first amplifier; an input (H) of said third high-frequency switch circuit is connected to said third amplifier (I), said input being on a side of an output of said second amplifier; a power source voltage is supplied all to said first, second, and third amplifier; an impedance of said third high-frequency switch circuit at a point where said third high-frequency switch circuit is connected to an input of said impedance conversion circuit is set to be low; and an impedance when seeing said impedance conversion circuit from an output of said third amplifier is set to be high, when the transmission power is reduced to be lower than a gain of said third amplifier, said bias control circuit performs a control in the following manner:
said first high-frequency switch circuit is switchingly connected to the side of said first amplifier; said input (C) of said second high-frequency switch circuit is connected to said second amplifier (D), said input being on the side of said output of said first amplifier; said input (H) of said third high-frequency switch circuit is connected to a side of said impedance conversion circuit (K), said input being on the side of said output of said second amplifier; the power source voltage is supplied only to said first and second amplifiers; the power source voltage for said third amplifier is interrupted; and an impedance when seeing said third amplifier from an output of said impedance conversion circuit is set to be high, when the transmission power is further reduced to be lower than a gain of said second amplifier, said bias control circuit performs a control in the following manner:
said first high-frequency switch circuit is switchingly connected to said first amplifier; said input (C) of said second high-frequency switch circuit is connected to said output terminal (E) of said third high-frequency switch circuit, said input being on the side of said output of said first amplifier; said input terminal (J) of said third high-frequency switch circuit is connected to a side of said impedance conversion circuit (K), said input terminal being on the side of said second high-frequency switch circuit; the power source voltage is supplied only to said first amplifier; the power source voltages for said second and third amplifiers are interrupted; and the impedance when seeing said third amplifier from said output of said impedance conversion circuit is set to be high, and, when the transmission power is further reduced to be lower than a gain of said first amplifier, said bias control circuit performs a control in the following manner:
said first high-frequency switch circuit is switchingly connected to an output terminal (F) of said second high-frequency switch circuit; and input terminal (G) of said second high-frequency switch circuit is switchingly connected to said output terminal (E) toward said third high-frequency switch circuit, said input being on the side of said first high-frequency switch circuit; said input terminal (J) of said third high-frequency switch circuit is connected to an output terminal (K) toward said impedance conversion circuit, said input terminal being on the side of said second high-frequency switch circuit; all the power source voltages for said first, second, and third amplifiers are interrupted; and the impedance when seeing said third amplifier from said output of said impedance conversion circuit is set to be high.

15. A power control method for a power amplifier according to claim 4, wherein
when a transmission power is at a maximum, said bias control circuit performs a control in the following manner:
said first high-frequency switch circuit is switchingly connected to said first amplifier; an input terminal of said second high-frequency switch circuit is connected to said first and second final amplifiers, said input terminal being on a side of said impedance converting means; said impedance switching means is turned on; a power source voltage is supplied all to said first amplifier, and said first and second final amplifiers; an impedance of said second high-frequency switch circuit at a point where said second high-frequency switch circuit is connected to an input of said impedance conversion circuit is set to be low; and an impedance when seeing said impedance conversion circuit from a point where said first and second final amplifiers are coupled to an output of said impedance conversion circuit is set to be high, when the transmission power is made sufficient by only said first amplifier and said first final amplifier, said bias control circuit performs a control in the following manner:

said first high-frequency switch circuit is connected to a side of said first amplifier; said input terminal of said second high-frequency switch circuit is connected only to said first final amplifier, said input terminal being on the side of said impedance converting means; said impedance converting means is turned off; the power source voltage is supplied to said first amplifier and said first final amplifier; the power source voltage for said second final amplifier is interrupted; the impedance of said second high-frequency switch circuit at the point where said second high-frequency switch circuit is connected to the input of said impedance conversion circuit is set to be low; the impedance when seeing impedance conversion circuit from the point where said first and second final amplifiers are coupled to the output of said impedance conversion circuit is set to be high; and an impedance when seeing said second final amplifier from the point where said first and second final amplifiers are coupled to the output of said impedance conversion circuit is set to be high, when the transmission power is made sufficient by only said first amplifier and said second final amplifier, said bias control circuit performs a control in the following manner:

said first high-frequency switch circuit is connected to the side of said first amplifier; said input terminal of said second high-frequency switch circuit is connected only to said second final amplifier, said input terminal being on the side of said impedance converting means; said impedance converting means is turned off; the power source voltage is supplied to said first amplifier and said second final amplifier; the power source voltage for said first final amplifier is interrupted; the impedance of said second high-frequency switch circuit at the point where said second high-frequency switch circuit is connected to the input of said impedance conversion circuit is set to be low; the impedance when seeing said impedance conversion circuit from the point where said first and second final amplifiers are coupled to the output of said impedance conversion circuit is set to be high; and an impedance when seeing said first final amplifier from the point where said first and second final amplifiers are coupled to the output of said impedance conversion circuit is set to be high, when the transmission power is further reduced to be lower than gains of said first and second final amplifiers, said bias control circuit performs a control in the following manner:

said first high-frequency switch circuit is connected to a side of said driver amplifier; said input terminal of said second high-frequency switch circuit is connected to said impedance conversion circuit, said input terminal being on the side of said impedance converting means; said impedance converting means is turned off; the power source voltage is supplied only to said first amplifier; the power source voltages for said first and second final amplifiers are interrupted; and impedances when seeing said first and second final amplifiers from the points where said first and second final amplifiers are connected to the output of said impedance conversion circuit are set to be high, and, when the transmission power is further reduced to be lower than the gain of said first amplifier, said bias control circuit performs a control in the following manner:

said first high-frequency switch circuit is switched toward said output terminal (G) of said second high-frequency switch circuit; said input terminal (H) of said second high-frequency switch circuit is switchingly connected to a side (F) of said impedance conversion circuit, said input terminal being on the side of said first high-frequency switch circuit; said impedance converting means is turned off; all the power source voltages for said first amplifier, and said first and second final amplifiers are interrupted; and the impedances when seeing said first and second final amplifiers from the points where said first and second final amplifiers are connected to the output of said impedance conversion circuit are set to be high.

16. A power control method for a power amplifier, according to any one of claims 13 to 15, wherein, when, in accordance with a level of the transmission power, said bias control circuit causes one of, or any combination of said first, second, and third amplifiers, and said first and second final amplifiers to be bypassed, the level of the transmission power at bypassing in a course of increasing is different from the level of the transmission power at bypassing in a course of decreasing.

17. A power control method for a power amplifier, according to any one of claims 13 to 15, wherein predistortion compensation is realized by a part of a high-frequency switch circuit connected to an input of at least one amplifier.

18. A communication equipment comprising:

a power amplifier including: an input terminal; an output terminal; an N number of bypassable amplification circuits which are connected directly or indirectly in a sequential manner between said input terminal and said output terminal; an impedance conversion circuit which is connected directly or indirectly between said amplification circuit of a final stage and said output terminal; and a bias control circuit which controls said amplification circuits, each of said amplification circuits including a high-frequency switch circuit, and an amplifier which is connected directly or indirectly to said switch circuit, said bias control circuit controls power source voltages of said amplifiers and controls status of said switch circuit, each of the amplification circuits sequentially connected to each other and individually bypassable between said input and output terminals, wherein a switch circuit of a respective amplification circuit selectively bypasses the respective amplification circuit by connecting an output signal from a prior adjacent amplification circuit to an input of a next adjacent amplification circuit;

an antenna;

a reception circuit;

a signal process circuit which processes a signal from said reception circuit by using said power amplifier; and a transmission circuit which performs a transmission process on a signal supplied from said signal process circuit.

19. A power amplifier according to claim 2 in which said power amplifier forms part of communication equipment comprising;

an antenna;

a reception circuit;

a signal process circuit which processes a signal from said reception circuit by using said power amplifier; and a transmission circuit which performs a transmission process on a signal supplied from said signal process circuit.

20. A power amplifier according to claim 3 in which said power amplifier forms part of communication equipment comprising;

an antenna;

a reception circuit;

a signal process circuit which processes a signal from said reception circuit by using said power amplifier; and a transmission circuit which performs a transmission process on a signal supplied from said signal process circuit.

21. A power amplifier according to claim 4 in which said power amplifier forms part of communication equipment comprising;

an antenna;

a reception circuit;

a signal process circuit which processes a signal from said reception circuit by using said power amplifier; and a transmission circuit which performs a transmission process on a signal supplied from said signal process circuit.

22. Power amplifiers according to claim 12 in which said power amplifiers forms part of communication equipment comprising;

an antenna;

a reception circuit;

a signal process circuit which processes a signal from said reception circuit by using said power amplifier; and a transmission circuit which performs a transmission process on a signal supplied from said signal process circuit.

23. A power amplifier for high frequency application comprising:

a power amplifier input terminal;

a power amplifier output terminal;

a plurality of bypassable amplification circuits coupled in sequence between said input terminal and said output terminal, each amplification circuit individually bypassable between said input terminal and said output terminal;

an impedance conversion circuit coupled between a final stage of said plurality of amplification circuits and said output terminal; and each of said plurality of amplification circuits including
(a) an amplifier,
(b) at least one circuit input and at least one circuit output, and
(c) a high frequency switch circuit coupled between said circuit input and said circuit output and selectively operable for bypassing said amplifier between said circuit input and said circuit output; and a bias control circuit coupled to each of said amplification circuits for controlling the overall power gain of the respective amplifier and controlling the operation of the respective switch circuit.

\* \* \* \* \*